May 9, 1967 W. ENGEL 3,319,173

HALL-VOLTAGE GENERATOR UNIT WITH AMPLIFYING ACTION, AND METHOD OF PRODUCING SUCH UNIT

Filed April 5, 1962

United States Patent Office 3,319,173

Patented May 9, 1967

3,319,173

HALL-VOLTAGE GENERATOR UNIT WITH AMPLIFYING ACTION, AND METHOD OF PRODUCING SUCH UNIT

Walter Engel, Nurnberg, Germany, assignor to Siemens-Schuckertwerke Aktiengesellschaft, Berlin-Siemensstadt, Germany Filed Apr. 5, 1962, Ser. No. 185,377
Claims priority, application Germany, Apr. 8, 1961, S 73,382
7 Claims. (Cl. 330—6)

Figure 1:
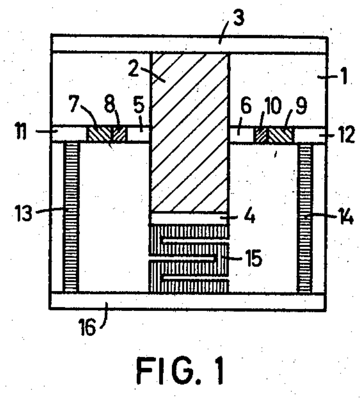

My invention relates to Hall-voltage generating devices in which the effect of a magnetic field upon a current-traversed wafer or layer of semiconductor material, called "Hall plate," distorts the voltage distribution in the Hall plate so that mutually spaced but normally equipotential points of the plate exhibit a potential difference which can be taken off by respective probe electrodes, called "Hall electrodes."

Such Hall generators have found increasing technological application due to improvements resulting from the use of semiconductor materials of extremely high mobility of the electric charge carriers, for example indium arsenide (InAs) and indium antimonide (InSb). Such Hall generators are now being employed, for example, for measuring magnetic fields, multiplying electric magnitudes and similar computing purposes, for sensing or scanning magnetic signal recordings and a variety of other purposes involving the presence of a magnetic field.

By suitably dimensioning the semiconductor layer that constitutes the Hall plate, such Hall generators also afford some degree of power amplification which, however, cannot always be given as high a gain as is desirable for many purposes. In such cases recourse must be taken to connecting the Hall generator to an amplifier, usually equipped with transistors, in order to produce the power necessary for further processing of the Hall-voltage signal.

Aside from the fact that the additional amplification involves an appreciable expenditure in material, space and cost, the necessary constructions in most cases also require making the electric leads for the Hall electrodes relatively long. This, in view of the rather slight power content of the Hall signal, entails the danger of disturbing effects, such as any noise factors, assuming undesirable proportions.

It is an object of my invention to provide a Hall-generator structural unit with amplifying action which avoids the above-mentioned disadvantages and which realizes the desired amplifying function in the immediate vicinity of the Hall plate, thus avoiding the use of relatively long electrode leads that operate under conditions of only low voltage levels.

According to my invention, I provide a single insulating plate or base with contact materials and semiconductor materials in such arrangement for doping as to constitute a Hall plate and two tunnel diodes immediately adjacent to, or contiguous with, the Hall plate at the respective localities of the two Hall electrodes. The two tunnel diodes, by virtue of the descending portion in their current-voltage characteristic, have eminent amplifying and switching properties.

Preferably, the resistors required for supplementing the complete amplifier circuit are likewise deposited upon the same base plate and, according to another feature of my invention, are preferably made of the same semiconductor material as the Hall plate and the tunnel diodes.

A Hall generator unit according to the invention is distinguished by exceptionally slight space requirements and constitutes a noise-poor amplifier of high gain. A power amplification of 40 db and more can be obtained.

Figure 2:
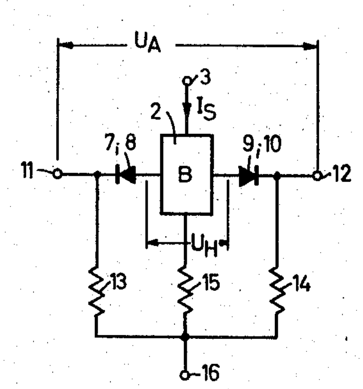

In order that the present invention may be readily carried into effect, it will now be described with reference to the accompanying drawing, in which:

FIG. 1 is a plan view of an embodiment of the amplifying Hall generator unit of the present invention on enlarged scale; and FIG. 2 is a schematic circuit diagram of the unit of FIG. 1.

A suitable manufacturing method for such a unit is described in the following.

The unit of FIG. 1 comprises a base plate 1 of insulating material, for example ceramic. Deposited upon the base plate 1 is the semiconductor material. This can be done by vaporizing onto the plate 1 a layer of indium antimonide and thereafter etching away the excessive areas. In this manner the base plate 1 is provided with semiconductor coatings that constitute a Hall plate 2 of rectangular shape and a number of semiconductor strips 7, 8, 9, 10, 13, 14 and 15. The semiconductor strips 13, 14 and 15 serve as ohmic resistors. The resistor 15 may be given a zig-zag or meander shape, as illustrated, in order to increase the resistance value.

Then indium pellets are placed upon the locations 8 and 10 whereafter the plate with the pellets is heated in order to cause alloying of the indium with the semiconductor material. As a result, strip-shaped tunnel diodes are produced at 7, 8, 9, 10. Thereafter a conducting metal, for example copper, is deposited for producing the internal circuit connections. This can be done by electrolytic deposition. The circuit connections thus made consist of the two Hall electrodes 5 and 6, two current supply electrodes 3 and 4 for the Hall plate 2, and external electrodes or leads 11, 12 and 16 of the unit.

In the circuit diagram of the unit shown in FIG. 2, the same reference numerals are applied as to the corresponding elements in FIG. 1. The controlling direct current $I_S$ is supplied through the terminals 3 and 16. The Hall plate 2 is traversed by a magnetic field which constitutes the controlling magnitude and is schematically indicated in FIG. 2 by B. The output voltage $U_A$ can be taken from the terminals 11 and 12 and constitutes the amplified Hall voltage $U_H$.

If one considers a change $\Delta B$ of the controlling magnetic induction B, then there results the known relation $\Delta U_H = K \cdot I_S \Delta B$. Wherein K denotes a constant corresponding to the quotient of the Hall coefficient and the thickness of the semiconductor layer. Also applicable is:

$$\Delta U_H = \Delta I_H \cdot 2 \cdot (R_{13} - R_t)$$

in which $\Delta I_H$ denotes the change of the Hall current $I_H$ flowing through the Hall electrodes. $R_{13}$ denotes the value of the resistor 13 in FIG. 2 which is equal to the value of the resistor 14. The term $-R_t$ denotes the negative resistance that corresponds to the descending portion in the characteristic of the tunnel diode. It follows that $$\Delta U_A = 2 \cdot R_{13} \cdot \Delta I_H = K \cdot I_s \cdot \Delta B \frac{R_{13}}{R_{13} - R_t}$$

If one now satisfies the matching condition $$R_H = 2 \cdot (R_{13} - R_t)$$

that is, if the internal resistance $R_H$ of the Hall generator between the Hall electrodes is made equal to twice the sum of the resistance value $R_{13}$ and the negative resistance value $R_t$, then one obtains the equation $$\Delta U_A = 2 \cdot K \cdot I_S \cdot \Delta B \cdot \frac{R_{13}}{R_H}$$

This leads to the following term for the resulting amplification:

$$\frac{\Delta U_A}{\Delta U_H}=2\cdot\frac{R_{13}}{R_H}$$

In order to obtain a high voltage amplification, the resistance values of resistors 13 and 14 should therefore be considerably higher than the internal resistance of the Hall generator between the Hall electrodes. It is preferable to adjust the working point of the tunnel diodes by suitable choice of the resistance value for resistor 15 so that the absolute value of the negative resistance $R_t$ is approximately equal to the absolute resistance value of the resistors 13 and 14.

Since the energy for the tunnel diode amplifier is taken from the control circuit of the Hall plate by means of the resistor 15, the entire unit requires only four external connections, which is just as many as required for an ordinary Hall plate. For this reason, the amplifying Hall generator unit of the present invention can be used without change in other circuitry wherever an ordinary Hall generator was previously utilized and furnishes a considerably higher output voltage and output power.

In lieu of the above-mentioned indium antimonide material, other semiconductor materials suitable for Hall plates and tunnel diodes can likewise be employed. It is not necessary to produce the Hall plate and the tunnel diodes of the same semiconductor material, but this considerably simplifies the production. The production method described above is also well suitable for automation so that the manufacturing cost for units according to the invention can be further reduced.

A preferred application of the Hall generator unit according to the invention is the sensing and scanning of magnetically recorded signals, particularly in conjunction with contactless or proximity-type signal transmitters, limit switches and the like. By virtue of the high output power of the amplifying Hall generator unit of the present invention a magnetically recorded or stored signal of very slight remanence induction is sufficient so that, for example, the storing capacity of magnetic memory devices can be increased to a considerable extent. However, the Hall generator unit according to the invention also affords the above-described simplification in design and improvement in performance in conjunction with various other uses.

It will be obvious to those skilled in the art, upon a study of this disclosure, that my invention permits various modifications with respect to arrangement and configuration of the components that make up an amplifying Hall generator unit according to the invention and hence can be given embodiments other than particularly illustrated and described herein, without departing from the essential features of my invention and within the scope of the claims annexed hereto.

I claim:

1. An amplifying Hall generator unit, comprising a base plate of electrically insulating material;
   an integral plate of semiconductor material on said base plate, said integral semiconductor plate comprising a Hall plate having two pairs of opposite sides, a pair of current supply electrodes extending from a pair of opposite sides of said Hall plate and a pair of Hall voltage electrodes extending from the other pair of opposite sides of said Hall plate, and first and second doped amplifier areas adjacent said other pair of opposite sides of said Hall plate, said first doped amplifier area electrically connecting one of said other pair of opposite sides of said Hall plate to a corresponding one of said pair of Hall voltage electrodes and said second doped amplifier area electrically connecting the other of said other pair of opposite sides of said Hall plate to a corresponding other of said pair of Hall voltage electrodes; and output means for deriving an amplified Hall voltage from the Hall voltage electrodes of said Hall plate.

2. An amplifying Hall generator unit as claimed in claim 1, wherein each of said first and second doped amplifier areas comprises a diode.

3. An amplifying Hall generator unit as claimed in claim 1, wherein each of said first and second doped amplifier areas comprises a tunnel diode.

4. An amplifying Hall generator unit as claimed in claim 1, wherein said base plate comprises ceramic material.

5. An amplifying Hall generator unit as claimed in claim 1, wherein said integral semiconductor plate further comprises a plurality of resistor strips, one of said resistor strips electrically connecting one of the current supply electrodes of said Hall plate to a common point in the connection between said first doped amplifier area and said one of the Hall voltage electrodes of said Hall plate and another of said resistor strips electrically connecting said one of said current supply electrodes to a common point in the connection between said second doped amplifier area and said other of the Hall voltage electrodes of said Hall plate.

6. An amplifying Hall generator unit as claimed in claim 5, wherein still another of said resistor strips electrically connects one of said pair of opposite sides of said Hall plate to said one of the current supply electrodes of said Hall plate.

7. An amplifying Hall generator unit as claimed in claim 6, wherein each of said first and second doped amplifier areas comprises a tunnel diode.

References Cited by the Examiner

UNITED STATES PATENTS

| | | | |
|---|---|---|---|
| 2,229,807 | 1/1941 | Hoppe et al. | 29—25.3 |
| 2,855,549 | 10/1958 | Kuhurt et al. | 317—234 |
| 2,877,394 | 3/1959 | Kuhurt | 317—234 |
| 2,980,860 | 4/1961 | Macdonald | 330—6 |
| 2,982,002 | 5/1961 | Shockley | 29—25.3 |
| 3,050,698 | 8/1962 | Brass | 330—6 |
| 3,090,014 | 5/1963 | Dacey | 307—88.5 |
| 3,158,756 | 11/1964 | Brunner et al. | 307—88.5 |

OTHER REFERENCES

IBM Mechanical Disclosure Bulletin, "Logical Device"; page 59. Vol. 2, No. 5, February 1960.

Article by Hubbard et al., "Microwave Isolator Combines Hall Effect and Tunnel Diodes," Electronics, June 16, 1961; pages 56 and 57.

ROY LAKE, *Primary Examiner.*

NATHAN KAUFMAN, *Examiner.*